(12) United States Patent
Matsui et al.

(10) Patent No.: US 10,162,018 B2
(45) Date of Patent: Dec. 25, 2018

(54) MAGNETIC SENSOR DEVICE

(71) Applicant: Mitsubishi Electric Corporation, Chiyoda-ku (JP)

(72) Inventors: Hideki Matsui, Chiyoda-ku (JP); Tatsuya Kunieda, Chiyoda-ku (JP); Tomokazu Ogomi, Chiyoda-ku (JP); Masaaki Okada, Chiyoda-ku (JP); Sadaaki Yoshioka, Chiyoda-ku (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 91 days.

(21) Appl. No.: 15/524,812

(22) PCT Filed: Jan. 26, 2016

(86) PCT No.: PCT/JP2016/052183
§ 371 (c)(1),
(2) Date: May 5, 2017

(87) PCT Pub. No.: WO2016/125634
PCT Pub. Date: Aug. 11, 2016

(65) Prior Publication Data
US 2018/0306873 A1 Oct. 25, 2018

(30) Foreign Application Priority Data

Feb. 2, 2015 (JP) .................. 2015-018152

(51) Int. Cl.
*G01D 5/16* (2006.01)
*G07D 7/04* (2016.01)
(Continued)

(52) U.S. Cl.
CPC ........... *G01R 33/0385* (2013.01); *G01D 5/16* (2013.01); *G01R 33/091* (2013.01); *G01R 33/096* (2013.01); *G07D 7/04* (2013.01)

(58) Field of Classification Search
None
See application file for complete search history.

(56) References Cited

U.S. PATENT DOCUMENTS

| | | |
|---|---|---|
| 2006/0076654 A1 | 4/2006 | Omura |
| 2014/0028308 A1 | 1/2014 | Ogomi et al. |
| 2014/0354385 A1 | 12/2014 | Okada et al. |

FOREIGN PATENT DOCUMENTS

| | | |
|---|---|---|
| JP | H02-085379 U | 7/1990 |
| JP | H08-201493 A | 8/1996 |

(Continued)

*Primary Examiner* — Jermele M Hollington
*Assistant Examiner* — Douglas X Rodriguez
(74) *Attorney, Agent, or Firm* — Oblon, McClelland, Maier & Neustadt, L.L.P.

(57) ABSTRACT

A magnetic sensor device that includes: a bar-shaped magnet; a soft magnetic carrier that is arranged parallel to magnet along the longitudinal direction of magnet, that has a magnetoresistive effect element on a surface thereof opposite to a surface facing magnet, and that extends across the lateral length of magnet; and a guide that has a bottom interposed between magnet and carrier and a side wall standing upright from the bottom along a side of magnet contacting a surface of magnet facing carrier, the bottom and the side wall being formed of a nonmagnetic body contacting magnet and extending in the longitudinal direction of magnet. The magnet is attracted to and held by the carrier, with the guide interposed therebetween, due to the magnetic attractive force between the magnet and the carrier.

20 Claims, 14 Drawing Sheets

(51) Int. Cl.
*G01R 33/09* (2006.01)
*G01R 33/038* (2006.01)

(56) References Cited

FOREIGN PATENT DOCUMENTS

| | | |
|---|---|---|
| JP | H11-101658 A | 4/1999 |
| JP | 2006-108359 A | 4/2006 |
| JP | 2012-255770 A | 12/2012 |
| JP | 2015-007580 A | 1/2015 |
| WO | 2013/114993 A1 | 8/2013 |

MAGNETIC SENSOR DEVICE

TECHNICAL FIELD

The present disclosure relates to a magnetic sensor device that detects a micromagnetic pattern formed on a sheet-like medium such as paper currency.

BACKGROUND ART

Patent Literature 1 discloses a magnetic sensor device that includes: a conveyance path for conveying a to-be-detected object; a magnet having a magnetic pole arranged on one side of the to-be-detected object and generating a cross magnetic field crossing the to-be-detected object; a magnetoresistive effect element that is arranged between the magnet and the to-be-detected object, has an output terminal, and outputs a change in a component in the conveying direction in the cross magnetic field as a change in a resistance value, the change being caused by the magnetic component of the to-be-detected object conveyed in the cross magnetic field. Patent Literature 1 discloses, as a configuration of a magnetic circuit for generating a cross magnetic field, a configuration in which magnets are arranged to face each other across the to-be-detected object, and a configuration in which a magnet is arranged on one side of the to-be-detected object, and a magnetic body is arranged on the another surface thereof facing the magnet.

Patent Literature 2 discloses a magnetic sensor that includes: a board, a magnetoresistive effect element that has a pair of magnetosensitive portions arranged parallel to each other with a constant distance apart from each other on the board; a conductor layer arranged at a position from which each of the pair of magnetosensitive portions are at an equal distance; and a resistance electrically connected in series with the conductor layer.

Patent Literature 3 discloses a configuration to obtain a long magnetic circuit that uses a plurality of short magnets that are arranged in an array, and that has a uniform magnetic flux density distribution in the array direction.

CITATION LIST

Patent Literature

Patent Literature 1: Unexamined Japanese Patent Application Kokai Publication No. 2012-255770
Patent Literature 2: Unexamined Japanese Patent Application Kokai Publication No. H08-201493
Patent Literature 3: International Patent Publication No. WO2013/114993

SUMMARY OF INVENTION

Technical Problem

In the magnetic sensor devices described in Patent Literature 1 and Patent Literature 2, the sensor output is affected by the magnetic flux density of a magnetic field generator formed of a magnet and a magnetic body. Therefore a long magnetic field generator that has a uniform magnetic flux density distribution in the longitudinal direction is required in order to obtain a long magnetic sensor device.

As a structure for obtaining a long magnetic field generator that has a uniform magnetic flux density distribution in the longitudinal direction, Patent Literature 3 discloses a structure in which magnets are fixedly arrayed in one line are between and in close contact with continuous ferrous-based metal yokes. However, when a magnet having a small coefficient of linear expansion is fixed in a ferrous-based yoke having a large coefficient of linear expansion compared with the magnet, a problem occurs in that the magnetic field generator warps or gets damaged due to the difference between the coefficients of linear expansion when an ambient temperature changes.

When the magnetic field generator is warped, the magnetic field generator interferes with the conveyance plane of the magnetic sensor device on which the to-be-detected object is conveyed, and the conveyance is hindered because of the to-be-detected object being caught by the magnetic sensor device. In addition, in the reading width direction (longitudinal direction) of the magnetic sensor device, there is a problem in that detection sensitivity is biased in the reading width direction and stable detection output cannot be obtained due to a difference in spacing between the to-be-detected object and the magnetic field generator.

When the magnetic field generator is damaged, the magnetic flux density of the magnetic field generator is not uniform in the longitudinal direction of the magnetic sensor device. Thus, sensor responses are not constant in the longitudinal direction of the magnetic sensor device.

The present disclosure was accomplished to solve the above-mentioned problems, and an objective of the present disclosure is to obtain the long magnetic sensor device in which the magnet does not warped or get damaged even when a temperature changes in a case where the coefficient of linear expansion of the magnet is different from that of a member fixing the magnet.

Solution to Problem

The magnetic sensor device according to the present disclosure includes:
a bar-shaped magnet;
a carrier that is arranged parallel to the magnet along the longitudinal direction of the magnet, that has a magnetoresistive effect element provided on a surface thereof that is opposite to another surface thereof facing the magnet, the carrier formed with a magnetic body that extends across the length of the magnet in the longitudinal direction; and
a guide that has a bottom portion interposed between the magnet and the carrier and a side wall portion standing upright from the bottom portion along a side surface of the magnet contacting in the longitudinal direction a surface of the magnet facing the carrier, the bottom portion and the side wall portion being formed of a nonmagnetic body contacting the magnet and extending in the longitudinal direction of the magnet;
wherein the magnet is attracted to and held by the carrier, with the guide interposed therebetween, due to the magnetic attractive force between the magnet and the carrier.

Advantageous Effects of Invention

According to the present disclosure, the magnet is fixed except in the longitudinal direction of the magnetic sensor device and is slidably disposed in the longitudinal direction by using the guide and the magnetic attractive force. Thus the magnetic field generator does not warp or get damaged due to the difference between the coefficients of linear expansion of the magnet and the yoke. The long magnetic sensor device can be obtained that can sense the to-bedetected object that has a magnetic component that remains stable even when an ambient temperature changes.

DESCRIPTION OF EMBODIMENTS

Figure 1:
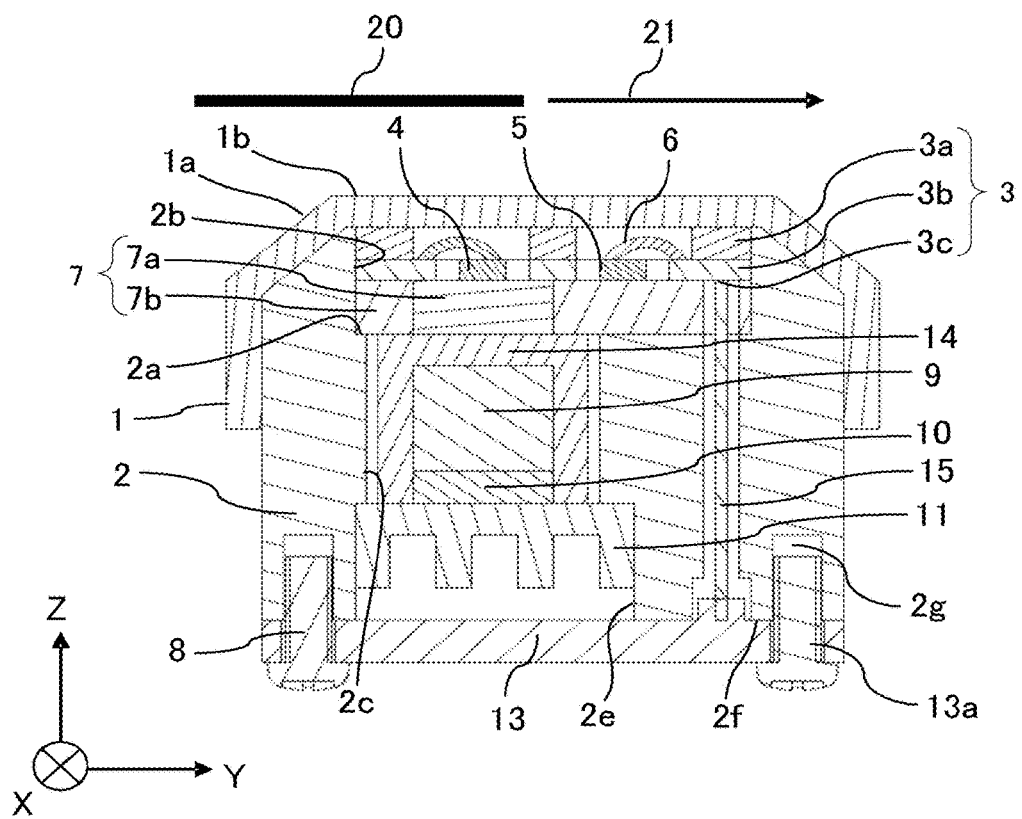
FIG. 1 is a sectional view in a plane orthogonal to a main scanning direction of a magnetic sensor device according to Embodiment 1 of the present disclosure.

Embodiments of the present disclosure are described below in reference to the drawings. In the drawings, parts indicated by the same reference sign are identical or corresponding parts.

Embodiment 1

Figure 2A:
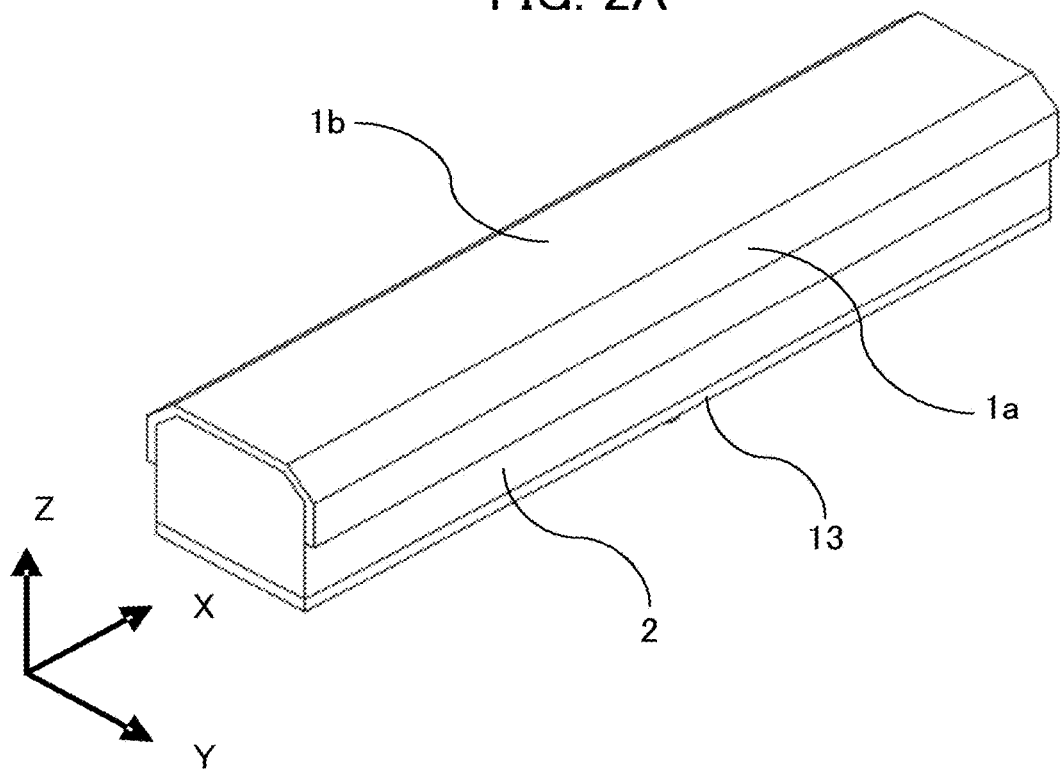
FIG. 2A is a perspective view illustrating the magnetic sensor device according to Embodiment 1 viewed from a conveyance path side.
Figure 2B:
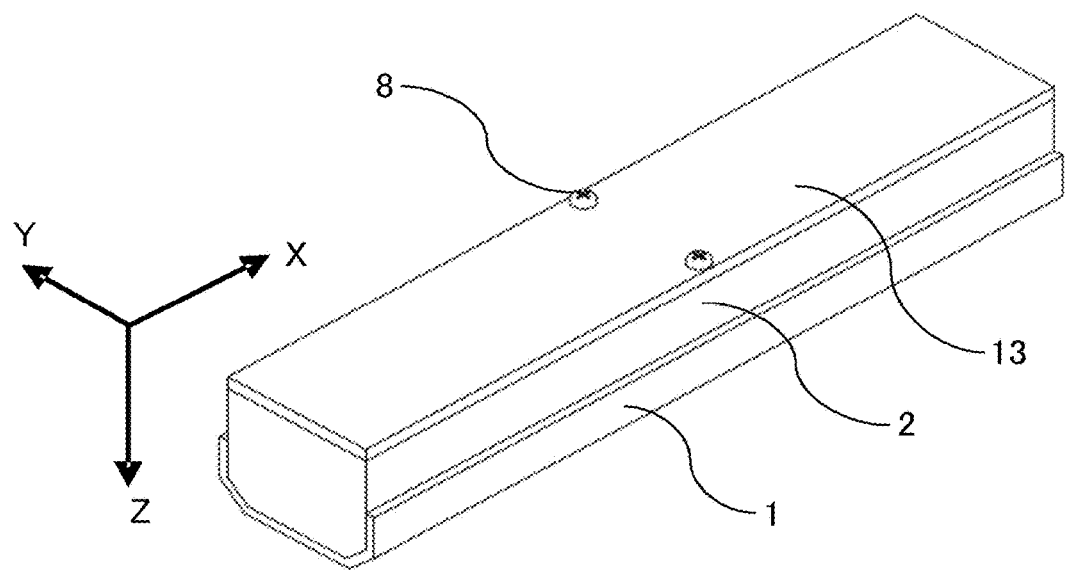
FIG. 2B is a perspective view illustrating the magnetic sensor device according to Embodiment 1 viewed from a bottom surface side.

FIG. 1 is a sectional view in a plane orthogonal to a main scanning direction of a magnetic sensor device according to Embodiment 1 of the present disclosure. FIG. 2A is a perspective view illustrating the magnetic sensor device according to Embodiment 1 viewed from a conveyance path side. FIG. 2B is a perspective view illustrating the magnetic sensor device according to Embodiment 1 viewed from a bottom surface side. Three axes X, Y, and Z in FIG. 1 indicate an orthogonal coordinate system defined to facilitate understanding of the figure.

The X-axis indicates a reading width direction (the main scanning direction) of the magnetic sensor device. The main scanning direction is the longitudinal direction of the magnetic sensor device. The Y-axis indicates a conveyance direction (sub-scanning direction) of a to-be-detected object with respect to the magnetic sensor device. The sub-scanning direction is a transverse direction of the magnetic sensor device. The Z-axis indicates a height direction of the magnetic sensor device.

In addition, in all embodiments of the present disclosure, a conveyance of the to-be-detected object is a relative movement between the magnetic sensor device and the to-be-detected object. The movement includes a case in which the to-be-detected object does not move and the magnetic sensor device itself moves in a direction opposite to the conveyance direction in addition to a case in which the magnetic sensor device is fixed and the to-be-detected object is conveyed.

In FIG. 1, the magnetic sensor device includes, in order, a magnetoresistive effect element 4, a carrier 7, a guide 14, a bar-shaped magnet 9 and a yoke 10, from the conveyance path of the to-be-detected object 20 towards the negative Z direction orthogonal to the main scanning direction (X direction) and orthogonal to the conveyance direction 21 (Y direction) of the to-be-detected object 20 such as paper currency. The bar-shaped magnet 9 is a quadrangular prism having a rectangular cross section. The longitudinal direction of the magnet 9 is arranged parallel to the main scanning direction. The carrier 7 is arranged parallel to the magnet 9 along the longitudinal direction of the magnet 9, and is formed of a magnetic body that extends over the length of the magnet 9 in the longitudinal direction (the main scanning direction). The magnetoresistive effect element 4 is installed on a surface opposite to the surface of the carrier 7, the surface facing the magnet 9.

The guide 14 has a bottom interposed between the magnet 9 and the carrier 7, and a side wall portion standing upright from the bottom along a side surface contacting a surface of the magnet 9 facing the carrier 7 along the longitudinal direction. The guide 14 has the bottom and the side wall portion contacting the magnet 9, and is formed of a non-magnetic body that extends in the longitudinal direction of the magnet 9.

The yoke 10 closely contacts a surface of the magnet 9 on the opposite side of the carrier 7. In Embodiment 1, the magnetic sensor device includes a radiator 11 closely contacting the outermost surface of the guide 14 on the opposite side of the carrier 7. The radiator 11 also contacts with the yoke 10. In addition, the magnetic sensor device includes a cover 1, a case 2, a sensor board 3, and a signal processing board 13.

The cover 1 is a member forming a conveyance plane 1b of the object to be tested in the magnetic sensor device. As illustrated in FIG. 2A, the cover 1 extends in the X direction on the conveyance path side of the magnetic sensor device, and is in a shape that covers the installation side of the magnetoresistive effect element 4 on a surface of the case 2 in the Z direction. The case 2 is in the shape of a frame having an opening for storing and holding each component of the magnetic sensor device, a positioning hole, and a mounting surface.

The sensor board 3 is interposed between the cover 1 and the carrier 7 and has a structure in which a non-conductive member 3a and a conductive member 3b in which a wiring pattern is provided are layered in the Z direction. The conductive member 3b is fixed to the carrier 7 and the non-conductive member 3a is fixed to the cover 1 respectively by a double sided tape or an adhesive. The sensor board 3 is, for example, formed of resin boards such as glass epoxy resin, bismaleimide-triazine resin (BT resin) or the like.

Figure 3A:
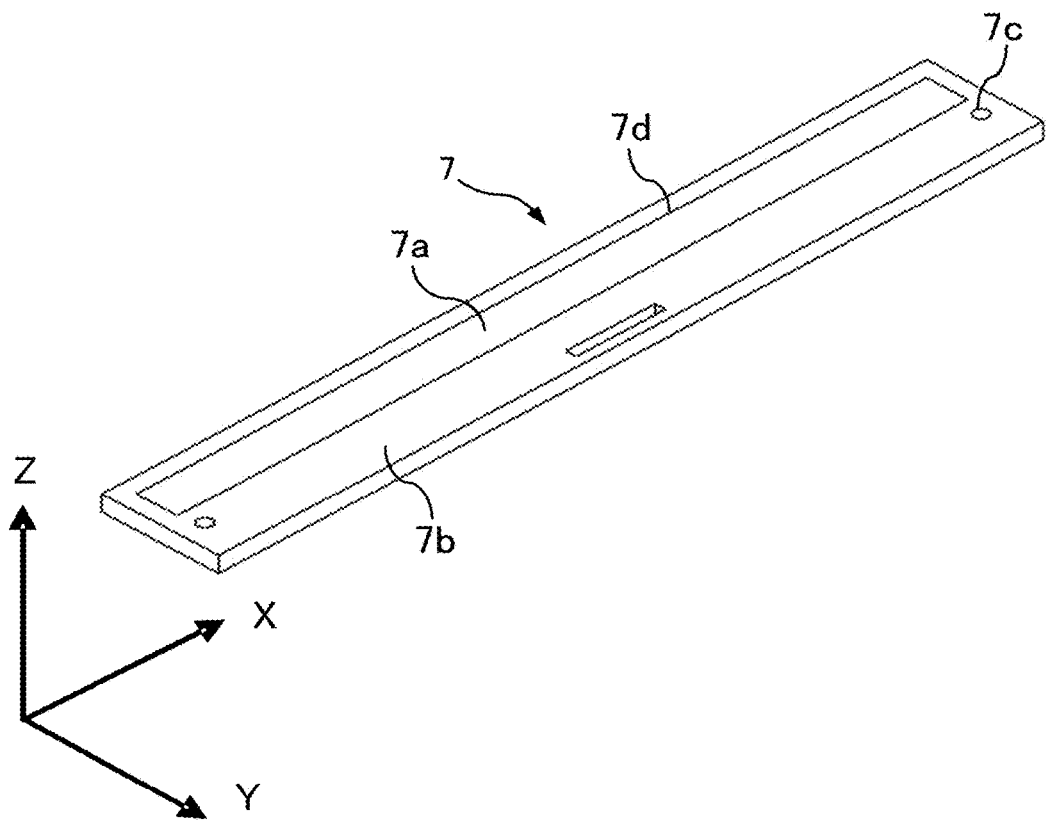
FIG. 3A is a perspective view illustrating a carrier in the magnetic sensor device according to Embodiment 1.
Figure 3B:
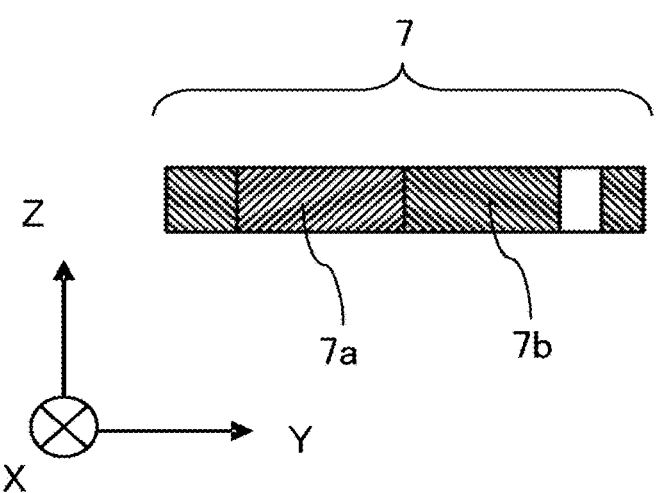
FIG. 3B is a sectional view illustrating the carrier according to Embodiment 1.

FIG. 3A is a perspective view illustrating the carrier in the magnetic sensor device according to Embodiment 1. FIG. 3B is a sectional view illustrating the carrier according to Embodiment 1. The carrier 7 is formed of a soft magnetic carrier 7a and a nonmagnetic carrier 7b, and has an integral structure in which the soft magnetic carrier 7a and the nonmagnetic carrier 7b are joined together in the Y direction. The carrier 7 is fitted in an opening 2b of the case 2, and is fixed by an adhesive or the like. The magnet 9 is arranged on a surface on the opposite side of a surface contacting the sensor board 3 of the carrier 7. The soft magnetic carrier 7a is formed of, for example, stainless steel, and the nonmagnetic carrier 7b is formed of, for example, brass.

As illustrated in FIG. 1, the magnetoresistive effect element 4 is fixed on a surface of the soft magnetic carrier 7a in the positive Z direction (conveyance path side) by an adhesive or the like, and electrically connects to the conductive member 3b of the sensor board 3 through a wire 6. A signal amplification IC5 is fixed on a surface of the nonmagnetic carrier 7b in the positive Z direction (conveyance path side) by an adhesive or the like. The signal amplification IC5 is electrically connected to the conductive member 3b of the sensor board 3 through the wire 6 and is electrically connected to the magnetoresistive effect element 4. The wire 6 is, for example, a metal wire such as a gold wire, an aluminum wire or the like.

As illustrated in FIG. 1, the cover 1 is a member forming the conveyance plane 1b to be detected in the magnetic sensor device, and is made of bent nonmagnetic metal sheet such as aluminum and the like so as not to affect the magnetic field. The cover 1 includes a taper 1a, a conveyance guide, thus the to-be-detected object 20 can be conveyed along the taper 1a during the conveyance, and the taper 1a can prevent the to-be-detected object 20 from being conveyed to directions except the conveyance direction (the Y direction).

The cover 1 plays a role of protecting the magnetic sensor device from any shock and any abrasion by colliding and rubbing when the to-be-detected object 20 is conveyed on the magnetic sensor device. In addition, the signal amplification IC5 reacts with light to generate noise. Thus the cover 1 also has a role in blocking outside light not to enter the signal amplification IC5. The cover 1 is disposed between the to-be-detected object 20 and the magnetoresistive effect element 4. Thus the material to be used for the cover 1 preferably is a nonmagnetic material not to affect the magnetism sensing performance.

In Embodiment 1 describes that the cover 1 is, as an example, manufactured of a bent metal sheet. Materials and manufacturing methods are not limited if the material meets the role mentioned above. For example, the cover 1 may be molded with resin having a light blocking effect.

Figure 4A:
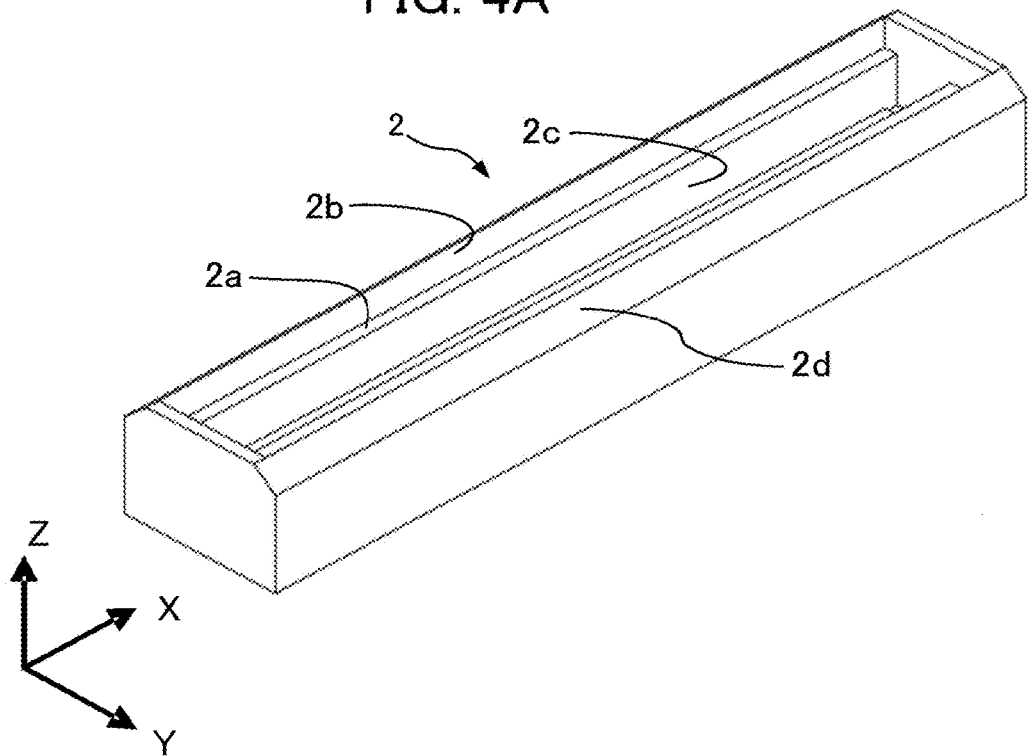
FIG. 4A is a perspective view illustrating a case of the magnetic sensor device according to Embodiment 1 viewed from the conveyance path side.
Figure 4B:
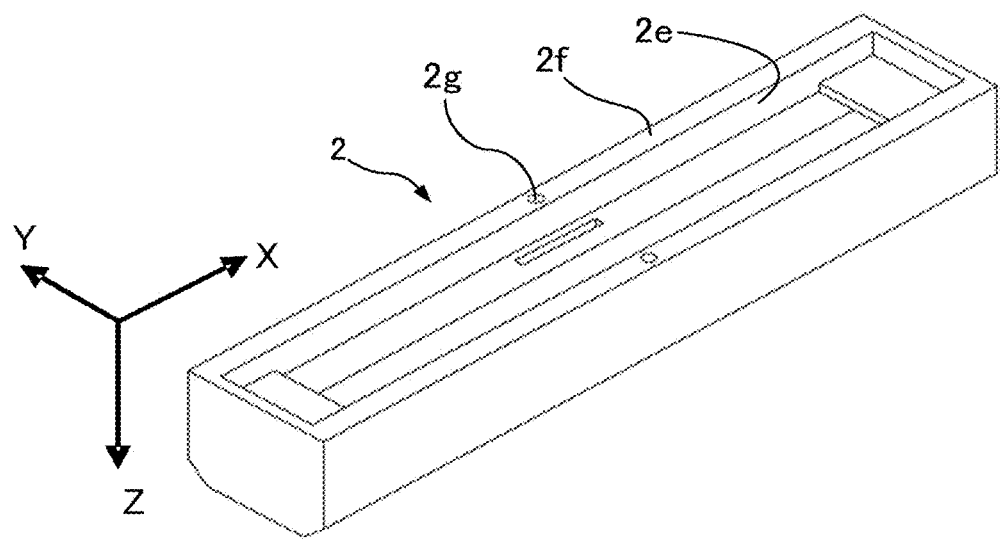
FIG. 4B is a perspective view illustrating the case of the magnetic sensor device according to Embodiment 1 viewed from the bottom surface side.

As illustrated in FIG. 1, the case 2 is a member to store other members inside. FIG. 4A is a perspective view illustrating a case of the magnetic sensor device according to Embodiment 1 viewed from the conveyance path side. FIG. 4B is a perspective view illustrating the case of the magnetic sensor device according to Embodiment 1 viewed from the bottom surface side. The case 2 is molded with black resin in which a step 2a, the opening 2b, an opening 2c, a cover support 2d, an opening 2e, a board mounting surface 2f, and a board mounting hole 2g are formed. The carrier 7 in which the sensor board 3, the magnetoresistive effect element 4, the signal amplification IC5, and the wire 6 are integrated is interposed between the cover 1 and the step 2a and is supported in the Z direction. The opening 2b positions, in the X direction and in the Y direction, the carrier 7 in which the sensor board 3, the magnetoresistive effect element 4, the signal amplification IC5, and the wire 6 are integrated. The opening 2c positions the integrated magnet 9 and the yoke 10 in the X direction and in the Y direction. The cover support 2d is an external surface slanted towards the conveyance direction 21 of the to-be-detected object 20. The slanted surface of the cover 1 contacts along the cover support 2d and is fixed to the case 2. When the radiator 11 is mounted on the yoke 10, the opening 2e forms surfaces that position the radiator 11 in the X direction and in the Y direction. The signal processing board 13 is positioned at the board mounting hole 2g using a fastener 8 such as a screw penetrating the board mounting hole 13a formed in the signal processing board 13 and is mounted on the board mounting surface 2f.

Because the signal amplification IC5 reacts with light and generates noise, thus, the case 2 also has a light-blocking role so that outside light does not reach the signal amplification IC5. In Embodiment 1, it is described that molded black resin is used to form the case 2. If the role mentioned above is satisfied, materials and the manufacturing methods are not limited.

As illustrated in FIG. 1, the sensor board 3 is formed of the non-conductive member 3a, the conductive member 3b, and a conductive member 3c. A space is provided in the non-conductive member 3a so that the cover 1 does not contact with the magnetoresistive effect element 4, the signal amplification IC5, and the wire 6. Wiring is provided in the conductive member 3b for transmitting electrical signals of the magnetoresistive effect element 4 and the signal amplification IC5. The conductive member 3c is electrically connected to a cable 15 and transmits an electrical signal to the signal processing board 13.

Figure 5A:
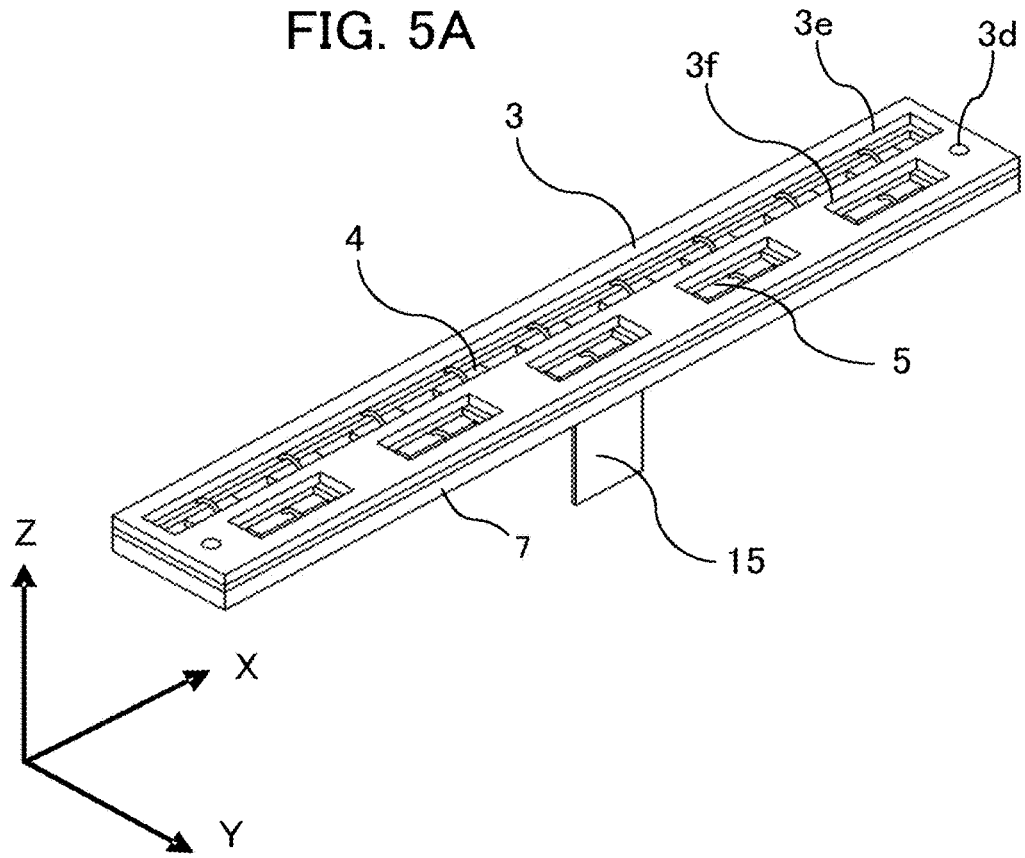
FIG. 5A is a perspective view illustrating a state in which a sensor board, the carrier, a magnetoresistive effect element, and a signal amplification IC are assembled in the magnetic sensor device according to Embodiment 1.
Figure 5B:
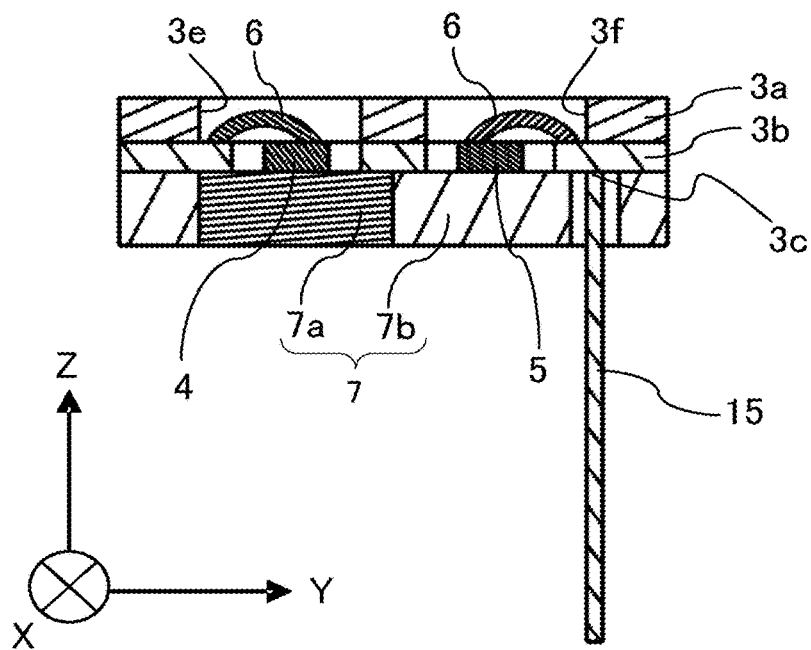
FIG. 5B is a sectional view illustrating a detector according to Embodiment 1.

FIG. 5A is a perspective view illustrating a state in which the sensor board, the carrier, the magnetoresistive effect element, and the signal amplification IC are assembled in the magnetic sensor device according to Embodiment 1. The sensor board 3, the carrier 7, the magnetoresistive effect element 4, and the signal amplification IC5 together constitute a detector. FIG. 5B is a sectional view illustrating a detector according to Embodiment 1. The sensor board 3 is mounted on a surface of the carrier 7 in the positive Z direction. The sensor board 3 is positioned in the Z direction by contacting the carrier 7. A positioning hole 3d is formed in the sensor board 3, and a positioning hole 7c is formed in the carrier 7. Positions in the XY directions are determined by, for example, inserting a pin through the positioning hole 3d and the positioning hole 7c and by fixing the positions. The at least two positioning holes 3d and the at least two positioning holes 7c are formed respectively.

The magnetoresistive effect element 4 is fixed by an adhesive or the like on the same surface as the surface on which the sensor board 3 of the soft magnetic carrier 7a is mounted. The position of the magnetoresistive effect element 4 in the Z direction is determined by the magnetoresistive effect element 4 contacting the soft magnetic carrier 7a. The magnetoresistive effect element 4 is arranged inside an opening 3e for the magnetoresistive effect element of the sensor board 3. Two centers of both ends of the positioning holes 3d of the sensor board 3 are connected by an imaginary line segment, the magnetoresistive effect element 4 is arranged parallel to the imaginary line segment and fixed, and the Y direction position of the magnetoresistive effect element 4 is determined. In addition, the center of the imaginary line segment mentioned above and the X direction center of the magnetoresistive effect element 4 are made the same, and the position of the X direction of the magnetoresistive effect element 4 is determined. If there is a request for positioning the detector portion of the magnetic sensor device, the X direction and the Y direction positions thereof may be offset parallel to the X direction and the Y direction.

The magnetoresistive effect element 4 detects a change of the conveyance direction component of the magnetic field generated by the to-be-detected object 20 including magnetic components such as the paper currency being conveyed in the conveyance direction 21. The change of the conveyance direction component of the magnetic field changes a resistance value of the magnetoresistive effect element 4, thereby changing a signal output by the magnetoresistive effect element 4. The signal amplification IC5 amplifies the signal output by the magnetoresistive effect element 4. The wire 6 electrically connects the magnetoresistive effect element 4 and the signal amplification IC5 to the conductive member 3b of the sensor board 3.

As illustrated in FIG. 1 and FIG. 5B, the signal amplification IC5 is fixed by an adhesive or the like on the same surface as the surface on which the sensor board 3 of the nonmagnetic carrier 7b is mounted, and the Z direction position is determined by the signal amplification IC5 contacting the carrier 7b. The XY direction positions of the signal amplification IC5 are determined so that the centers of the XY directions of the signal amplification IC5 and the centers of the XY directions of an opening 3f for the signal amplification IC are fixed to be the same positions respectively.

As illustrated in FIG. 1, FIG. 3A, and FIG. 3B, the carrier 7 includes the soft magnetic carrier 7a and the nonmagnetic carrier 7b. The Z direction position of the carrier 7 is determined by contacting one surface of the carrier 7 in the Z direction with the step 2a of the case 2, and each position of the X direction and the Y direction of the carrier 7 is determined respectively by contacting the surfaces of the X direction and the Y direction of the carrier 7 with the opening 2b. The carrier 7 has a role of supporting the sensor board 3 in the Z direction, and the soft magnetic carrier 7a has a role of arranging the direction of the magnetic field generated by the magnet 9 in the Z direction.

Figure 6A:
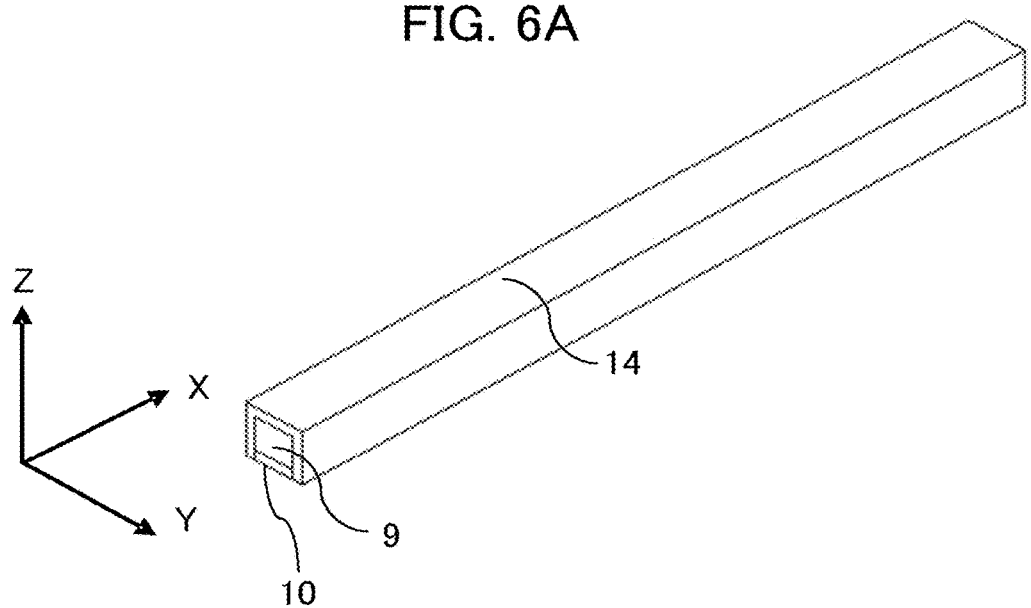
FIG. 6A is a perspective view illustrating a magnetic field generator in the magnetic sensor device according to Embodiment 1.
Figure 6B:
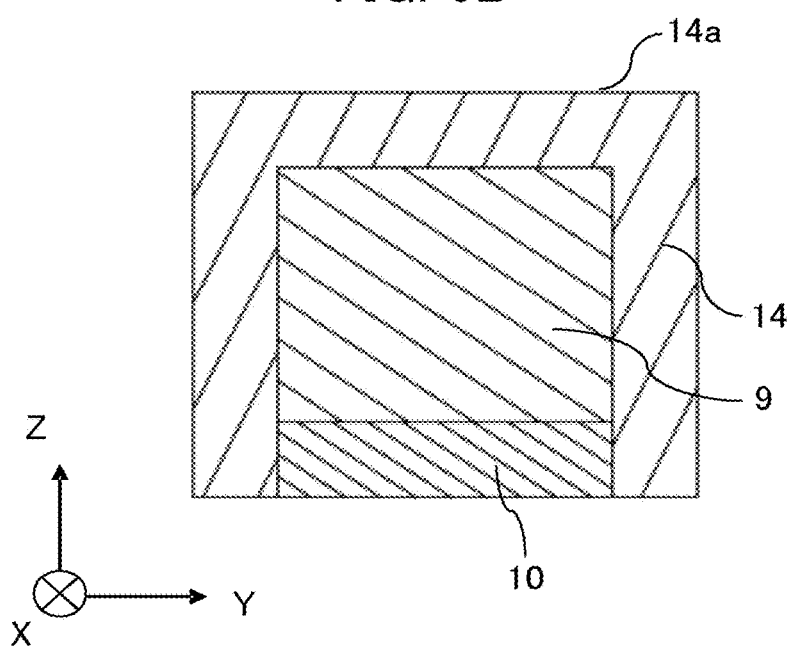
FIG. 6B is a sectional view illustrating the magnetic field generator according to Embodiment 1.

FIG. 6A is a perspective view illustrating a magnetic field generator in the magnetic sensor device according to Embodiment 1. FIG. 6B is a sectional view illustrating the magnetic field generator according to Embodiment 1. The magnetic field generator includes the magnet 9, the yoke 10, and the guide 14. The square U-shaped section of guide 14 parallel to the YZ plane extends in the X direction, and one surface of the guide 14 contacts a surface in the negative Z direction of the carrier 7. The surface of the guide 14 parallel to the XZ plane stands in the Z direction from the both ends of the surface contacting the carrier 7 in sub-scanning direction, and the guide 14 has a structure in which the magnet 9 fits in the inside of the Square U-shaped section. The guide 14 is fixed to the carrier 7 by an adhesive or the like. The guide 14 is formed of a nonmagnetic metal such as aluminum or resin, but, for the radiation improvement as is described below, a nonmagnetic metal is desirable. For example, the guide 14 is molded by metal extrusion processing.

The magnet 9 is retained in a state of contacting the guide 14 interposed between the magnet 9 and the carrier 7 due to the attracting force attracting the soft magnetic carrier 7a by magnetism. A neodymium sintering magnet, for example, is used for the magnet 9.

The yoke 10 is a metal plate having soft magnetism that is attracted to the surface in the negative Z direction opposite side of the carrier 7 of the magnet 9 by magnetism of the magnet 9. A side wall portion of the guide 14 exists in the Y direction of the yoke 10, and the side wall portion stops the yoke 10 moving in the Y direction. The yoke 10 is formed of soft magnetic bodies such as stainless steel, iron or the like.

The radiator 11 illustrated in FIG. 1 is a member for radiating heat in the inside of the magnetic sensor device to the outside air, and closely contacts with the outermost surface of the guide 14 on the opposite side of the carrier 7, and contacts with a surface on the opposite side of a surface of the yoke 10 contacting the magnet 9. The radiator 11 is desirably formed of a nonmagnetic metal such as aluminum or the like. The radiator 11 is fitted in the opening 2c in the case 2, and is adhered by an adhesive or the like. The signal processing board 13 is electrically connected to the sensor board 3 through the cable 15, and is mounted on the external side of the radiator 11 on the opposite side of the surface contacting the cover 1 of the case 2.

As illustrated in FIG. 1 and FIG. 6B, the section of the guide 14, that is parallel to the YZ plane, has the square U-shape. The magnet 9 and the yoke 10 are fitted inside the Square U-shaped section of the guide 14 and the Square U-shaped section limits the movement of the magnet 9 and the yoke 10 in the Y direction. The magnet 9 is arranged at a position nearer than the yoke 10 to the carrier 7. Dimensions of the magnet 9 and the yoke 10 in the X direction of and the Y direction are equal to dimensions of inside of the guide 14 in the X direction and the Y direction. The yoke 10 is retained in a state of being attracted and contacted to the magnet 9 due to the magnetic force of the magnet 9. Furthermore, an adhesive or the like may be used as assistance of retention of the yoke 10 due to the magnetic force.

The integrated guide 14, the magnet 9, and the yoke 10 together constitute a magnetic field generator. The magnetic field generator is arranged in parallel with a row of the magnetoresistive effect element 4 in the longitudinal direction. The magnet 9 has a role in generating a magnetic field and providing the to-be-detected object 20 with a magnetic force, and the yoke 10 has a role in reinforcing the magnetic field generated by the magnet 9. The guide 14 desirably is formed of a nonmagnetic material not to affect the magnetic field.

The Z direction position of the magnetic field generator is determined by contacting a carrier adhesion surface 14a of the guide 14 to a surface opposing a surface on which the magnetoresistive effect element 4 of the carrier 7 is fixed. The X direction position of the magnetic field generator is determined by making the X direction center of the guide 14 and the X direction center of the magnetoresistive effect element 4 the same position, and the Y direction position is determined by making the Y direction center of the guide 14 and the Y direction center of the magnetoresistive effect element 4 the same position. The guide 14 is fixed to the carrier 7 using an adhesive or the like.

When the Y direction position of the guide 14 changes, the Y direction position of the magnet 9 fitted in the inside of the guide 14 also changes, thereby changing magnetic forces acting on the magnetoresistive effect element 4 and the to-be-detected object 20. Therefore the Y direction position of the guide 14 should be finely adjusted while watching the performance of the magnetic sensor device.

The guide 14 is fixed to the carrier 7. The magnet 9 is retained by the attractive force that causes the magnet 9 to come close to the soft magnetic carrier 7a across the guide 14, the attractive force being a magnetic force. Thus, the magnet 9 is slidable in the X direction as the magnet 9 is attracted to and held by the guide 14. An elastic fixing material such as a silicon-based adhesive or the like may be used in combination for the fixation of the magnet 9 and the guide 14 as an aid to hold the position of the magnet 9 by the magnetic force.

In Embodiment 1 of the present disclosure, a metal is extruded and formed to be the guide 14 is assumed by way of example. However, materials and manufacturing methods need not be limited if a member that satisfies the role mentioned above is used.

As illustrated in FIG. 1, the radiator 11 is bonded on the outermost surface of the guide 14 on the opposite side of the carrier 7 and on the surface of the yoke 10 on the opposite side of the magnet 9 by an adhesive or the like, and thus the Z direction position of the radiator 11 is determined. The X direction position and the Y direction position of the radiator 11 are determined by contacting each of the X direction surface and the Y direction surface of the radiator 11 to the opening 2e of the case 2. The radiator 11 has a role in radiating the heat generated mainly by the magnetoresistive effect element 4 and the signal amplification IC5 to outside, and preventing the magnetic sensor device itself from being heated to a high temperature.

As illustrated in FIG. 1, the Z direction position of the signal processing board 13 is determined by contacting one of the Z direction surfaces of the signal processing board 13 to the board mounting surface 2f of the case 2. In addition, the X direction position and the Y direction position of the signal processing board 13 are determined by fixing the signal processing board 13 using the fastener 8 in a state in which the axis of the board mounting hole 2g of the case 2 and the axis of the board mounting hole 13a of the signal processing board 13 are aligned. If the fastener 8 is a screw, caulking or the like that can fix the signal processing board 13 to the case 2, here, the fastening method does not matter.

A manufacturing method of the magnetic sensor device according to Embodiment 1 is described below. The basic process of this manufacturing method includes a carrier assembling process, a sensor board assembling process, a magnetic field generator assembling process, and a final assembling process. Among these processes, the carrier assembling process is required to be performed before the sensor board assembling process, and the final assembling process is required to be performed after the other processes.

As illustrated in FIG. 3A and FIG. 3B, the carrier assembling process is a process to fix the soft magnetic carrier 7a to an opening 7d of the nonmagnetic carrier 7b. The fixation methods include an adhesion by a resin adhesive or joining by caulking. When there is a difference in thickness between the soft magnetic carrier 7a and the nonmagnetic carrier 7b, one surface in the Z direction, as a reference, is fixed so that there is no step on the referenced surface.

The magnetic sensor device according to Embodiment 1 has the soft magnetic carrier 7a having a role in aligning the direction of the magnetic field generated by the magnet 9 in the Z direction. However, there is a case in which magnetic field arrangement in the Z direction is not necessary depending on the sensitivity required by the magnetic sensor device. In that case, the soft magnetic carrier 7a is not necessary, and the nonmagnetic carrier 7b without the opening 7d becomes the carrier 7. In that case, no carrier assembling process is necessary.

The sensor board assembling process is a process in which the carrier 7 is adhered to the sensor board 3, and the magnetoresistive effect element 4 and the signal amplification IC5 are arranged on the carrier 7 and connected to the sensor board 3. An adhesive is coated on a joint surface between the carrier 7 and the sensor board 3, and as previously mentioned, the positioning hole 3d and the positioning hole 7c are aligned and positioned by inserting a pin or the like, and the sensor board 3 is fixed to the carrier 7. As illustrated in FIG. 5A, each of the magnetoresistive effect elements 4 and the signal amplification IC5 are arrayed and adhered in parallel with the line segment connecting the positioning holes 7c at both ends among at least two positioning holes 7c existing at the carrier 7. Each of the signal amplification IC5 and the magnetoresistive effect element 4 are electrically connected through the conductive member 3b of the sensor board 3 and the wire 6.

When the sensor board 3, the magnetoresistive effect element 4, and the signal amplification IC5 are mounted on the carrier 7, the mounting surface should be the same surface as the surface on which the soft magnetic carrier 7a and the nonmagnetic carrier 7b are fixed with no step.

When the magnetoresistive effect element 4 is mounted to the soft magnetic carrier 7a, the magnetoresistive effect element 4 is not supposed to stick out (to the board side) from the opening 3e for the magnetoresistive effect element of the sensor board 3. Similarly, when the signal amplification IC5 is mounted to the nonmagnetic carrier 7b, the signal amplification IC5 is not supposed to stick out (to the board side) from the opening 3f for the signal amplification IC of the sensor board 3.

As illustrated in FIG. 6A and FIG. 6B, the magnetic field generator assembling process is a process of integrating the guide 14, the magnet 9, and the yoke 10. The number of the magnet 9 is not limited to one, and a plurality of magnets 9 may be arrayed in the main scanning direction and integrated.

The magnet 9 and the yoke 10 are fitted in a recess of the guide 14 having the square U-shaped section. The guide 14 and the yoke 10 are arranged to surround four surfaces of the magnet 9 in the Y direction and in the Z direction. The yoke 10 is retained by magnetic force of the magnet 9. However, the retention by the magnetic force may be assisted by using an adhesive or the like so that the position of the yoke 10 does not change. As the force to retain the magnet 9 and the yoke 10 is not applied to the recess of the guide 14, the magnet 9 and the guide 14 may be provisionally fixed by an adhesive or the like so as not to be released in the foregoing assembling process. In this case, elastic fixation materials such as the silicon-based adhesive are desirable for the temporary fixation material.

The Z direction position and the Y direction position of the magnet 9 are determined by inserting the magnet 9 in the recess of the guide 14, and contacting the bottom surface of the recess and a pair of sidewalls erected at both ends of the bottom surface in the conveyance direction. Longitudinal direction positions of the magnet 9 and the guide 14 are determined by making one surface of one end in the longitudinal direction of the guide 14 flush with one surface of the one end in the longitudinal direction of the magnet 9.

The Z direction position of the yoke 10 is determined by attaching the yoke 10 to the surface of the magnet 9 in the Z direction, the surface not in contact with the guide 14. The X direction position of the yoke 10 is determined by making one surface of one end in the X direction of the yoke 10 flush with one surface of the one end in the X direction of the magnet 9. The Y direction position of the yoke 10 is determined by making one surface of one end in the Y direction of the yoke 10 flush with one surface of the one end in the Y direction of the magnet 9.

The final assembling process is a process in which the magnetic field generator is joined to the carrier 7 on which the sensor board 3 is fixed, is housed in the case 2 and fixed, the radiator 11 is fixed in magnetic field generator, and the cover 1 and the signal processing board 13 are fixed in the case 2.

Figure 7:
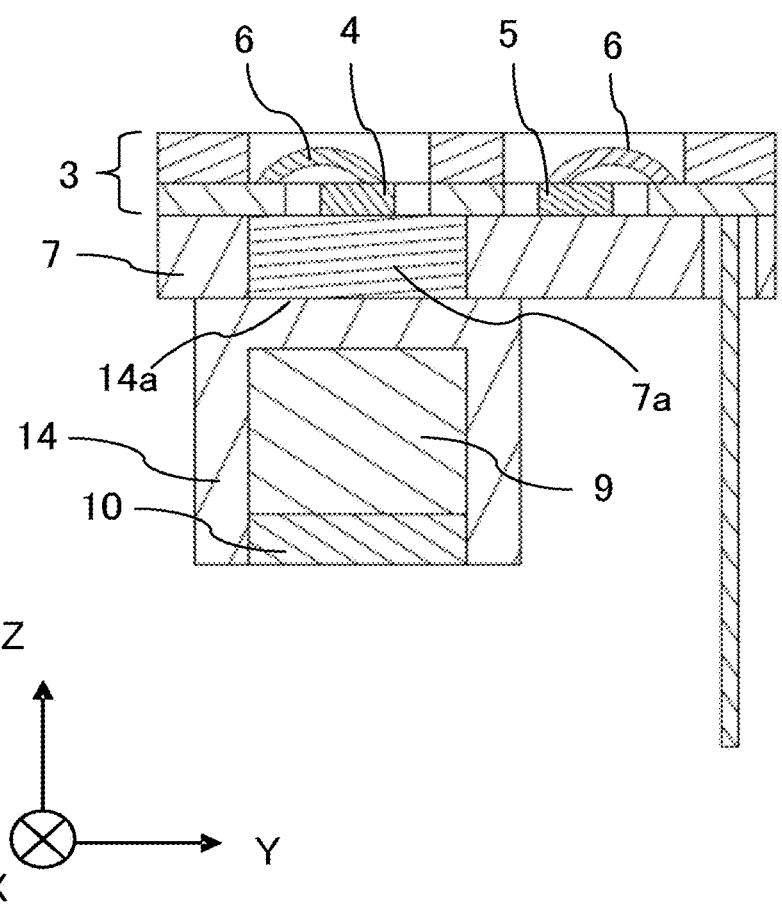
FIG. 7 is a sectional view illustrating a state in which a sensor and the magnetic field generator of the magnetic sensor device according to Embodiment 1 are joined.

FIG. 7 is a sectional view illustrating a state in which a sensor and the magnetic field generator of the magnetic sensor device according to Embodiment 1 are joined. The carrier adhesion surface 14a of the guide 14 forming the magnetic field generator is contacted on a surface on the opposite side of the surface on which the sensor board 3 of the carrier 7 is adhered. The guide 14 is made along the soft magnetic carrier 7a, and the center of the guide 14 in the X direction and the center of the soft magnetic carrier 7a in the X direction are aligned. As the performance of the magnetic sensor device changes depending on the position of the magnet 9 fitted in the guide 14, an extra jig capable of adjusting the fixed position of the magnet 9 may be used.

The attractive force that causes, by the magnetic force, the magnet 9 fitted in the guide 14 to come close to the soft magnetic carrier 7a works by contacting the guide 14 with the carrier 7. Thus the Z direction position of the magnet 9 is retained in the state of being fitted in the guide 14. There are cases in which the guide 14 and the magnet 9 are provisionally fixed by an adhesive or the like. In this case the provisional fixation materials are desirably elastic fixation materials such as a silicon-based adhesive or the like.

Figure 8:
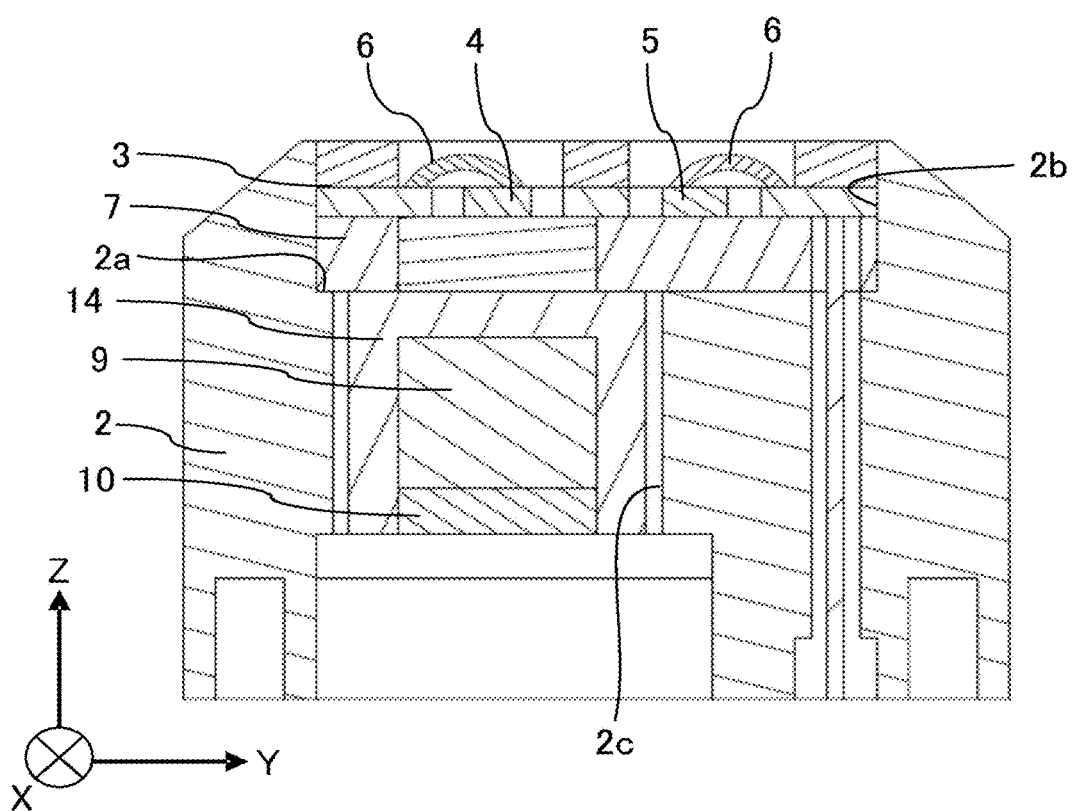
FIG. 8 is a sectional view illustrating a state in which the sensor and the magnetic field generator are assembled in the case of the magnetic sensor device according to Embodiment 1.

FIG. 8 is a sectional view illustrating a state in which the sensor and the magnetic field generator are assembled in the case of the magnetic sensor device according to Embodiment 1. In the state of joining the sensor and the magnetic field generator, the surface on the opposite side of the surface on which the sensor board 3 of the carrier 7 is adhered is contacted to the step 2a of the case 2, the X direction surface of the carrier 7 and the X direction surface of the opening 2b of the case 2 are contacted, the Y direction surface of the carrier 7 and the Y direction surface of the opening 2b of the case 2 are contacted, and the carrier 7 is fitted in the opening 2b. Then, the magnet 9 fits in the opening 2c in the case 2.

Figure 9:
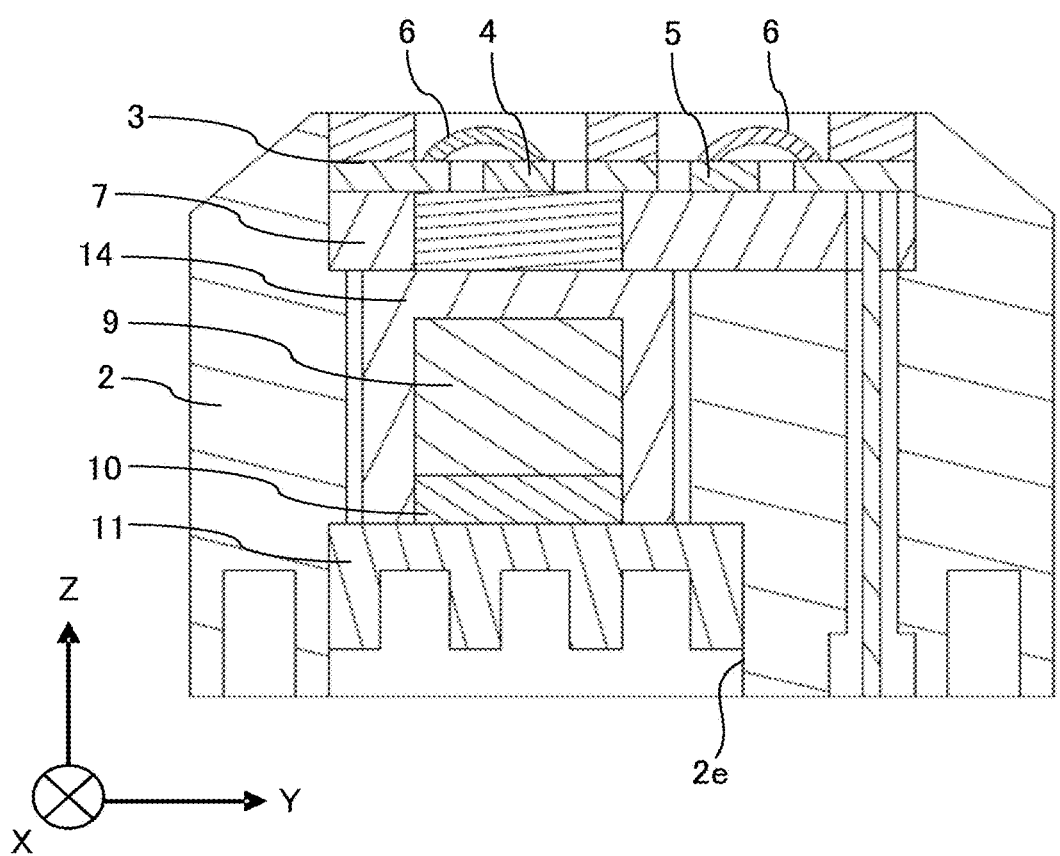
FIG. 9 is a sectional view illustrating a state in which a radiator is attached in the state illustrated in FIG. 8.

FIG. 9 is a sectional view illustrating a state in which a radiator is attached in the state illustrated in FIG. 8. The radiator 11 is bonded to the outermost surface of the guide 14 that is opposite to the carrier 7 and bonded to a surface of the yoke 10 that is opposite to the surface adhered to the magnet 9. The X direction position and the Y direction position of the radiator 11 are determined by the radiator 11 being fitted in the opening 2e of the case 2.

Figure 10:
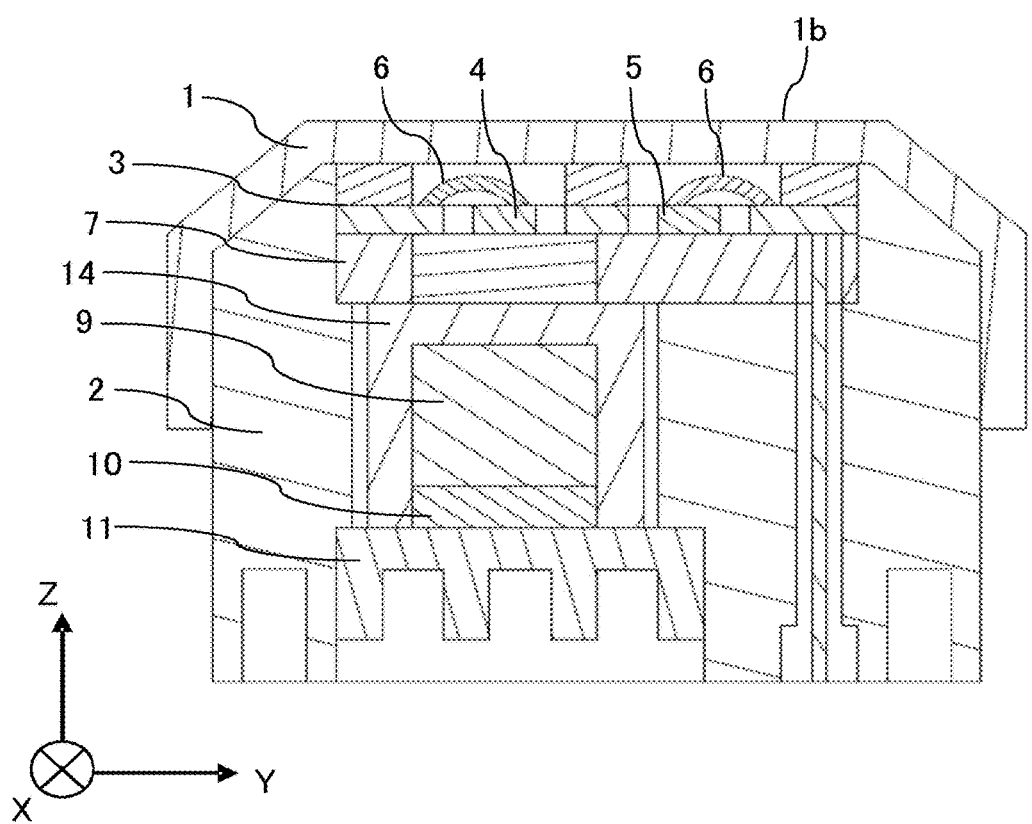
FIG. 10 is a sectional view illustrating a state in which a cover is attached in the state illustrated in FIG. 9.

FIG. 10 is a sectional view illustrating a state in which a cover is attached in the state illustrated in FIG. 9. A surface on the opposite side of the conveyance plane 1b of the cover 1 is bonded on a surface on the opposite side of the carrier 7 of the sensor board 3. The cover 1 is attached so that the cover 1 covers up one side of the case 2 in the Z direction. The X direction position of the cover 1 is determined by aligning the X direction center of the cover 1 and the X direction center of the case 2.

As illustrated in FIG. 1 and FIG. 4B, one Z direction surface of the signal processing board 13 is contacted with the board mounting surface 2f of the case 2, center axes of at least two board mounting holes 13a provided in the signal processing board 13 and center axes of at least two board mounting holes 2g provided in the case 2 are aligned, and X direction positions of the signal processing board 13 and the case 2 and Y direction positions of the signal processing board 13 and the case 2 are determined to be fastened using the fastener 8. In addition, the cable 15 electrically connects the signal processing board 13 and the sensor board 3.

The above-mentioned steps complete the final assembling process, and the magnetic sensor device illustrated in FIG. 1 through FIG. 2B is completed. In addition, in Embodiment 1, the guide 14 has two side wall portions along each of the two side surfaces at both ends of the magnet 9 in the Y direction. If one of the positive or negative Y direction movements of the magnet 9 can be regulated at the side surface of the opening 2c in the case 2, only the opposite side wall portion is enough to be provided. As in Embodiment 1, when the guide 14 has two side wall portions along each of the two side surfaces at both ends of the magnet 9 in the Y direction, an extra working space can be provided in the opening 2c in the Y direction. Thus it is easy to adjust the Y direction position of the magnet 9 for the magnetoresistive effect element 4. In addition, the magnet 9 is columnar. However, the section thereof is not limited to a rectangle or a square. For example, the section thereof may be even a trapezoid or a parallelogram. For example, if the section of the magnet 9 is asymmetrical with respect to the ZX plane like a parallelogram, the magnetic field becomes asymmetrical in the ZX plane. Then, a behavior of the magnet 9 is described when the temperature of the magnetic sensor device changes.

When the temperature of the magnet 9 changes with the temperature change of the magnetic sensor device, in proportion to the amount of change of the temperature and dimensions of the magnet 9, the each dimension of the magnet 9 expands or contracts in the X, Y and Z directions. The Y direction and the Z direction dimensions of the magnet 9 are small relative to the X direction length, and are not greatly changed by a temperature change. However, a temperature change increases the X direction length of the magnet 9 in proportion to the reading width of the magnetic sensor device. In order to obtain a long magnetic sensor device, it is necessary to increase the X direction length of the magnet 9. The amount of change in the X direction length of the magnet 9 when the temperature of the magnetic sensor device changes increases in proportion to the X direction length.

When the magnet 9 is expanded or contracted in the X direction by a temperature change, the Y direction position and the Z direction position do not change due to the attractive force making the magnet 9 come close to the soft magnetic carrier 7a due to the magnetic force of the magnet 9 and because of the magnet 9 contacting to the guide 14. Therefore the magnet 9 expands or contracts only in the X direction along the guide 14.

The magnet 9 may be bonded to the guide 14 and the yoke 10 using an adhesive or the like. However, it is necessary to use a soft adhesive such as a kind of silicone not to limit an expansion or a contraction in the X direction of the magnet 9 relative to the guide 14.

In order to prevent the position of the magnet 9 from shifting, the magnet 9 may be firmly fixed to the yoke 10 formed of stainless steel and the carrier 7 formed of brass using hard resin such as a kind of epoxy. The carrier 7 is assumed to be formed of the stainless steel soft magnetic carrier 7a and the brass nonmagnetic carrier 7b. The general stainless steel coefficient of linear expansion ranges 9 through 18 [$10^{-6}$/K], and the general brass coefficient of linear expansion ranges 18 through 23 [$10^{-6}$/K].

When a neodymium sintering magnet is used for the magnet 9 in Embodiment 1, the magnet 9 is assumed to be magnetized in the Z direction, and the general coefficient of linear expansion of the neodymium sintering magnet is −2.3 [$10^{-6}$/K] in directions orthogonal to the magnetization (X direction and Y direction), and 6.8 [$10^{-6}$/K] in a direction parallel to the magnetization (Z direction). The coefficients of linear expansion of stainless steel and brass and the coefficient of linear expansion of the neodymium sintering magnet have directions opposite to each other. Thus, when the temperature changes in the state in which the magnet 9 is strongly fixed, a force, parallel to the adhesion surface between the yoke 10 or the carrier 7 and the magnet 9 whose linear expansions are different, is applied. The force parallel to the surface warps or damages the magnet 9.

In the magnetic sensor device according to Embodiment 1, the guide 14 retaining the magnet 9 is fixed to the carrier 7. The magnet 9 is retained by the attractive force that causes the magnet 9 to come close to the soft magnetic carrier 7a across the guide 14 by the magnetic force. As the magnet 9 is attracted and retained to the guide 14 by the magnetic force, the magnet 9 is slidable in the X direction with respect to the guide 14. When an ambient temperature changes, even if the expansion/contraction amounts of the carrier 7 and the magnet 9 are different, the magnet 9 expands/contracts with respect to the guide 14 without being regulated by the guide 14. Thus no stress is applied to the magnet 9. As the result, the magnet 9 does not warp or get damaged.

In addition, in Embodiment 1, the aluminum guide 14 is fixed to the carrier 7 by an adhesive or the like. As the coefficient of linear expansion of general aluminum is 23 [$10^{-6}$/K], depending on the combination with materials of the carrier 7, the magnet 9 warps or gets damaged similar to the fixed magnet 9. However, as aluminum does not affect the magnetic circuit, the aluminum cross-sectional shape can be changed regardless of the performance of the magnetic sensor device. Therefore rigidity can be increased by changing the cross-sectional shape of the guide 14 and can be opposed to the force generated by the difference of the coefficients of linear expansion.

Next, a path through which the heat generated in the magnetic sensor device is radiated to the external air is described.

The main heat generation sources in the magnetic sensor device are the magnetoresistive effect element 4 and the signal amplification IC5. In Embodiment 1, the use of aluminum as a material of the guide 14 can efficiently conduct the heat generated at the magnetoresistive effect element 4 and the signal amplification IC5 to the radiator 11.

The heat generated in the magnetoresistive effect element 4 and the signal amplification IC5 is conducted to the carrier 7 with which the magnetoresistive effect element 4 and the signal amplification IC5 contact. Members contacted by the carrier 7 are the sensor board 3, the case 2, and the guide 14. Among these, the non-conductive member 3a of the sensor board 3 is made of glass epoxy, and thermal conductivity is low (the thermal conductivity of the general glass epoxy: 0.4 [W/(m K)]), and the heat is hard to be conducted, as the non-conductive member 3a does not include metal for heat conduction. In addition, the case 2 is made of resin that has low thermal conductivity (the thermal conductivity of the general polycarbonate resin: 0.24 [W/(m K)]), and heat is hard to be conducted. Thus, most of the heat conducted to the carrier 7 is conducted to the guide 14 (the thermal conductivity of general aluminum: 236 [W/(m K)]).

The guide 14 contacts with the carrier 7, the magnet 9, the yoke 10, and the radiator 11. The heat conducted to the guide 14 from the carrier 7 is conducted to the magnet 9, the yoke 10, and the radiator 11. As the magnet 9 only contacts to the guide 14 and the yoke 10. Thus the heat conducted from the guide 14 to the magnet 9 is conducted to the yoke 10. As the yoke 10 only contracts to the guide 14, the magnet 9, and the radiator 11, the heat conducted from the guide 14 and the magnet 9 to the yoke 10 is conducted to the radiator 11. As the guide 14 directly contacts with the radiator 11, the heat is directly conducted from the guide 14 to the radiator 11. The heat of the radiator 11 is convected and radiates in the opening 2e and is conducted to the signal processing board 13 and to the external air via a wiring pattern of the signal processing board 13, particularly the ground, a wiring pattern of the power supply, and a via hole.

When the magnet 9 directly contacts with the carrier 7 without using the guide 14, the heat is conducted from the carrier 7 to the magnet 9, from the magnet 9 to the yoke 10, and from the yoke 10 to the radiator 11, and is then released to the external air.

When aluminum is used for the material of the guide 14; as aluminum has a thermal conductivity higher than the magnet 9 (in Embodiment 1, the thermal conductivity of the neodymium sintering magnet, a general neodymium sintering magnet: 6.5 [W/(m K)]), more heat is conducted to the radiator 11 and the heat dissipation amount to the external air can be increased in the configuration according to Embodiment 1 with the guide 14 than in the configuration without the guide 14.

When heat release to the external air increases, as a temperature rise in the magnetic sensor device is suppressed, a demagnetizing of the magnet 9 can be suppressed and a stable output with no sensitivity drop can be obtained.

Embodiment 2

Figure 11:
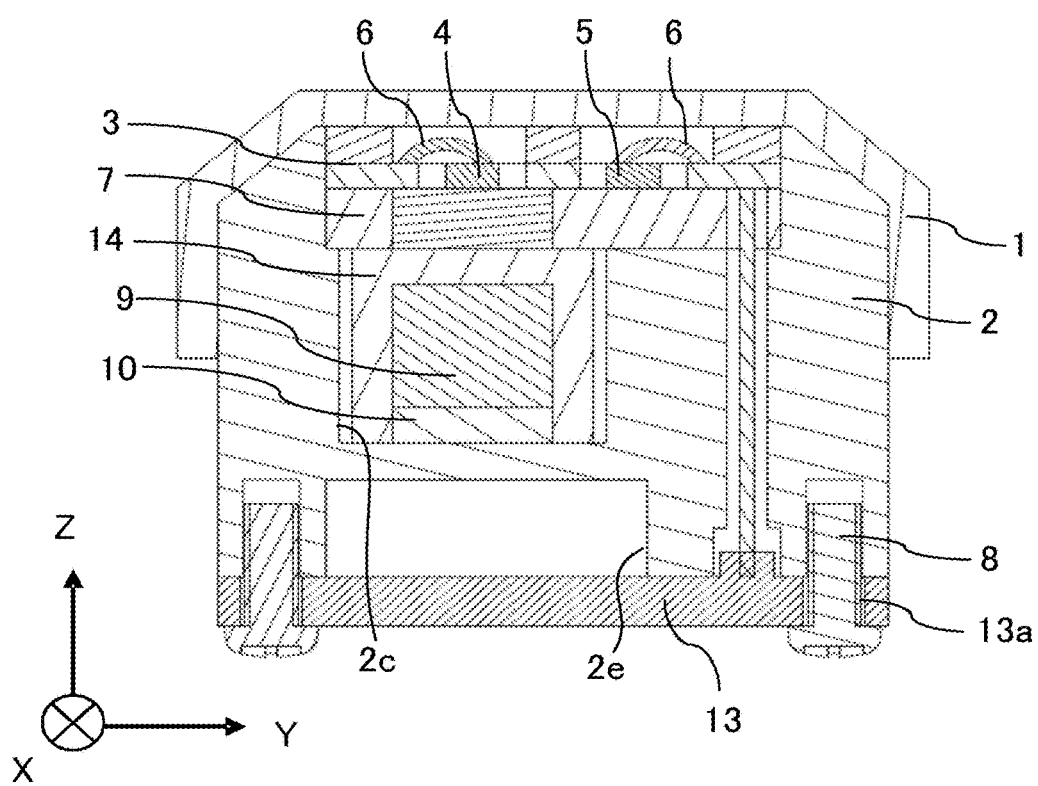
FIG. 11 is a sectional view in a plane orthogonal to a main scanning direction of a magnetic sensor device according to Embodiment 2 of the present disclosure.

FIG. 11 is a sectional view in a plane orthogonal to the main scanning direction of the magnetic sensor device according to Embodiment 2 of the present disclosure. In Embodiment 2, as a material of a case 2, in place of resin having low thermal conductivity, a metal, for example, such as magnesium that has high thermal conductivity is used. The thermal conductivity of general magnesium is 156 [W/(m K)].

The heat generated by the magnetoresistive effect element 4, the signal amplification IC5 and the like can be diffused in the whole magnetic sensor device by replacing the case 2, having the largest volume among components forming the magnetic sensor device, with a material having high thermal conductivity. The heat diffusion in the whole magnetic sensor device increases areas contributing the heat radiation, and increases the amount of heat radiation. The heat generated inside the magnetic sensor device is mainly conducted to the case 2, and radiated to the external air from the outer surface of the case 2. Thus the radiator 11 is not required to be provided inside the case 2.

As illustrated in FIG. 11, in the magnetic sensor device according to Embodiment 2, there is no radiator 11 and the opening 2c is not communicated with the opening 2e. Other configurations are the same as Embodiment 1. A surface of the guide 14 on the opposite side of the carrier 7 and a surface on the opposite side of the magnet of the yoke 10 contact with the bottom surface of the opening 2c formed in the case 2. The heat conducted to the guide 14 is conducted to the case 2 at the bottom surface of the opening 2c and is radiated to the external air from the outer surface of the case 2.

The heat generated in the magnetoresistive effect element 4 and the signal amplification IC5 is conducted to the carrier 7, conducted from the carrier 7 to the case 2, and radiated from the case 2 to the external air by using a material having high thermal conductivity for the case 2. The thermal resistance between the heat source and the external air decreases and heat radiation efficiency is improved by radiating heat to the external air without conducting through the guide 14 and the magnet 9, and the yoke 10.

In addition, also in Embodiment 2, the side wall portion of the guide 14 may be provided only on the opposite side if the side surface of the opening 2c in the case 2 can regulate a movement of the magnet 9 in the positive or negative Y direction.

Embodiment 3

Figure 12A:
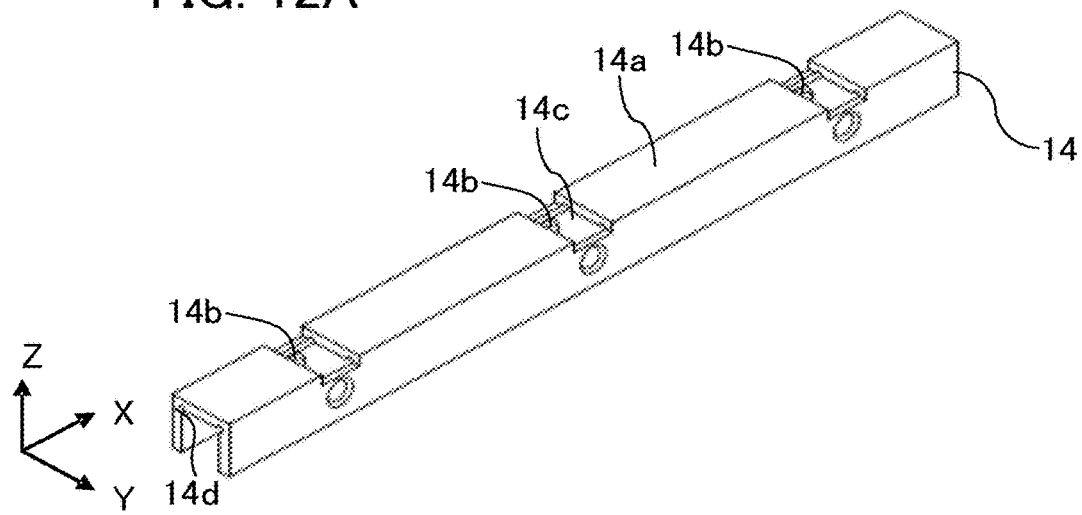
FIG. 12A is a perspective view of a guide of a magnetic sensor device according to Embodiment 3 of the present disclosure viewed from a conveyance path side.
Figure 12B:
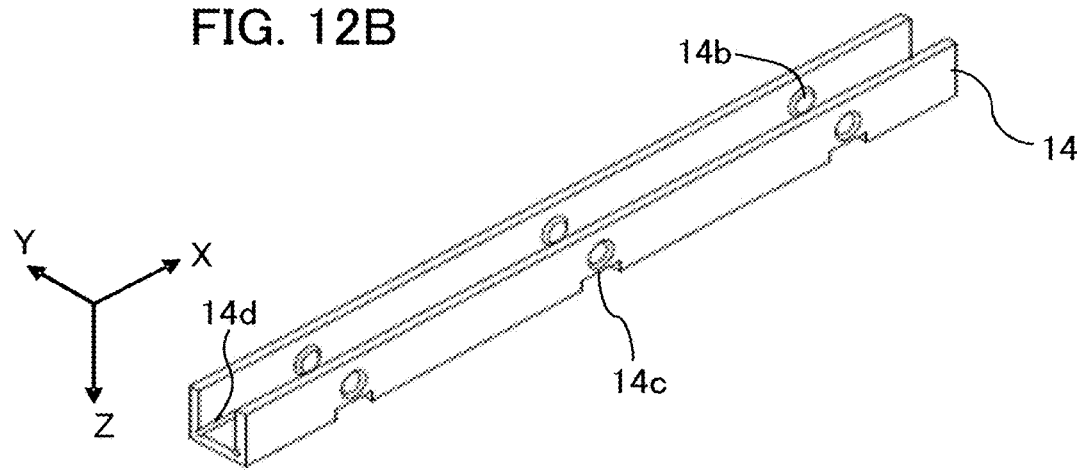
FIG. 12B is a perspective view of the guide of the magnetic sensor device according to Embodiment 3 viewed from a bottom surface side.
Figure 12C:
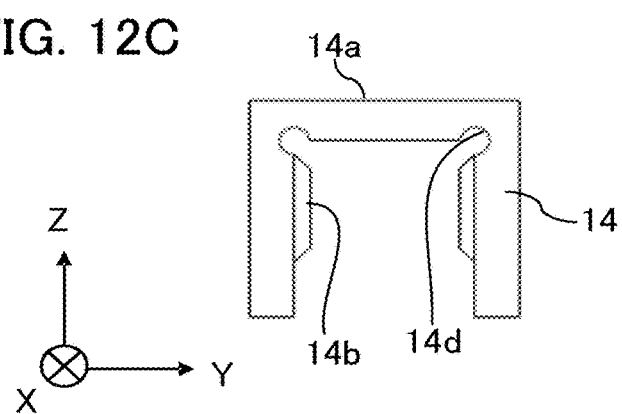
FIG. 12C is a side view of the guide of the magnetic sensor device according to Embodiment 3.

FIG. 12A is a perspective view of a guide of the magnetic sensor device according to Embodiment 3 of the present disclosure viewed from a conveyance path side. FIG. 12B is a perspective view of the guide of the magnetic sensor device according to Embodiment 3 viewed from a bottom surface side. FIG. 12C is a side view of the guide of the magnetic sensor device according to Embodiment 3. The magnetic sensor device of Embodiment 3 is different from that of Embodiment 2 in the shape of the guide. Other configurations are the same as Embodiment 2.

Figure 13A:
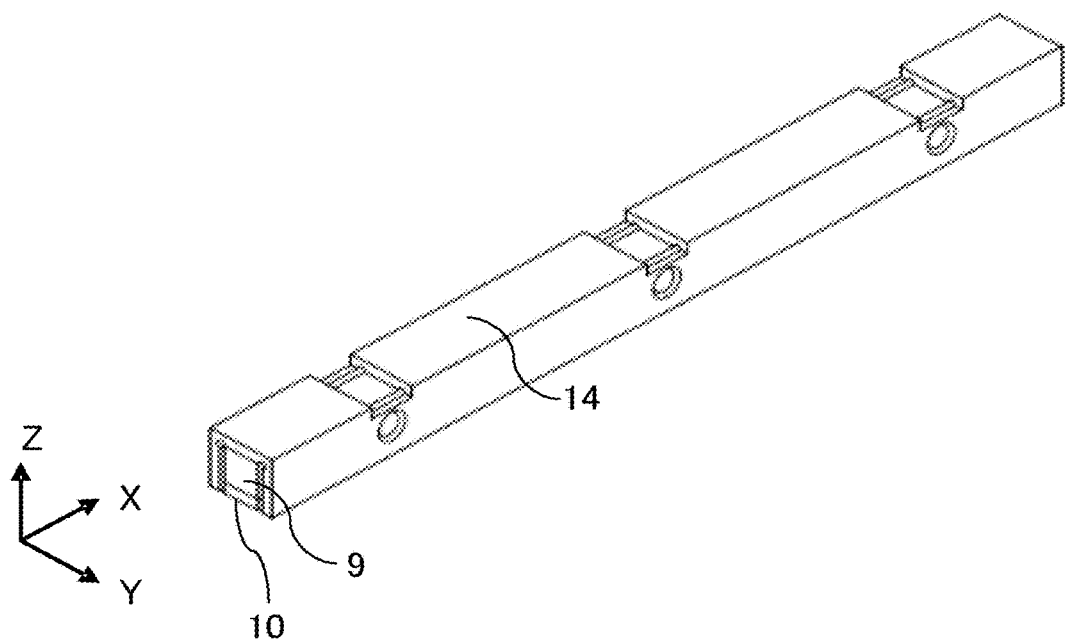
FIG. 13A is a perspective view illustrating a state in which a magnet and a yoke are fitted in the guide according to Embodiment 3.
Figure 13B:
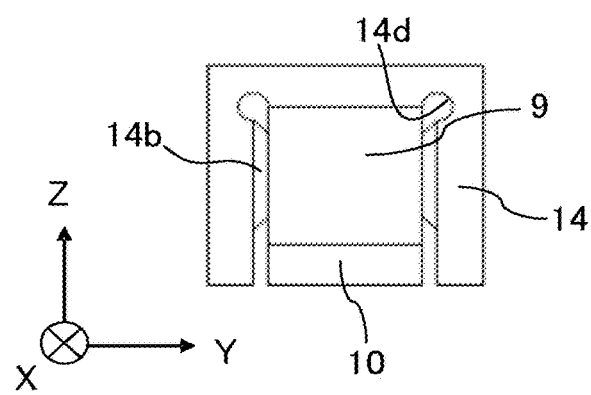
FIG. 13B is a side view illustrating a state in which the magnet and the yoke are fitted in the guide according to Embodiment 3.

FIG. 13A is a perspective view illustrating a state in which a magnet and a yoke are fitted in the guide according to Embodiment 3. FIG. 13B is a side view illustrating a state in which the magnet and the yoke are fitted in the guide according to Embodiment 3. The guide 14 in Embodiment 3 has a projection 14b contacting the magnet 9 in the inside surface of the Square U-shaped section of the guide 14. Reduction of a contact area between the magnet 9 and the guide 14 decreases the frictional resistance between the magnet 9 and the guide 14 in the magnetic field generator assembling process and facilitates the assembling of the magnetic field generator.

In Embodiment 3, the projection 14b of the guide 14 is molded by embossing to push out from the back side of the surface contacting the magnet 9 up to the middle of the board thickness in a mold, and therefore the back side of the projection 14b has a recess.

An opening 14c is formed at the bottom of the position of the projection 14b in the guide 14. This is because, when the guide 14 is formed by sheet metal bending, a sheet metal bending jig cannot be positioned due to being blocked by the projection 14b, and this is because the positive Z direction portion of the projection 14b cannot be bent at a right angle. If not bent at a right angle, when the magnet 9 is fitted in the guide 14, a corner portion of the magnet 9 interferes with the guide 14. Thus the magnet 9 is fixed in an inclined state. If the magnet 9 is inclined, the magnetic field applied to the magnetoresistive effect element 4 changes, and the performance of the magnetic sensor device deteriorates.

During the sheet metal bending, roundness of a minute bending radius occurs at the inside corner of the bent portion. As a measure against this, a relief groove is preliminarily formed in the sheet metal. A relief groove 14d can be arranged at the right angle bent portion of the guide 14 through the sheet metal bending using this method. The existence of the relief groove 14d eliminates any contact between the corner portion of the magnet 9 and the guide 14 in an unnecessary portion, and the performance of the magnetic sensor device is stabilized.

In addition, also in Embodiment 3, the side wall portion of the guide 14 may be provided only on the opposite side if the side surface of the opening 2c in the case 2 can regulate a movement of the magnet 9 in the positive or negative Y direction.

Embodiment 4

Figure 14:
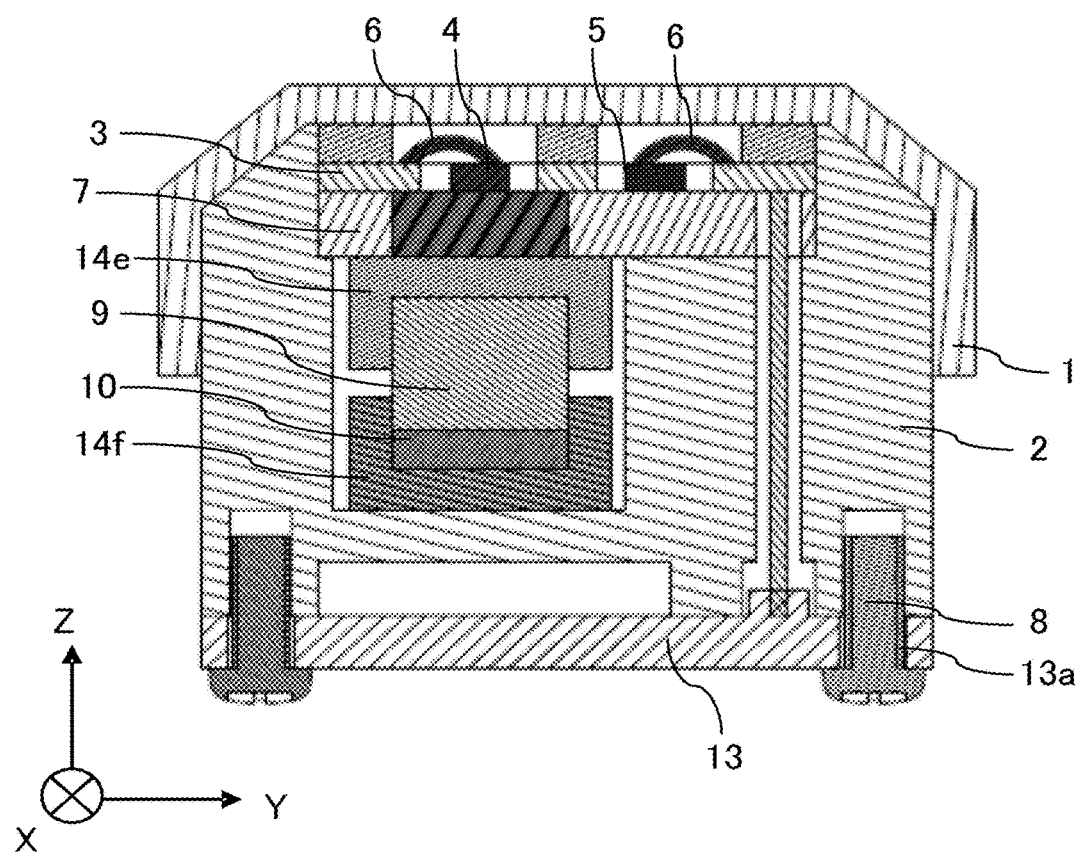
FIG. 14 is a sectional view in a plane orthogonal to a main scanning direction of a magnetic sensor device according to Embodiment 4 of the present disclosure.

FIG. 14 is a sectional view in a plane orthogonal to the main scanning direction of the magnetic sensor device according to Embodiment 4 of the present disclosure. In Embodiment 4, a guide 14e is formed of resin as a material and the height of the side wall portion is up to a middle of the height of the magnet 9. A yoke holder 14f for covering the side of the magnet 9 and the yoke 10 is provided to regulate the movement of the yoke 10 in the Y direction. Other configurations are the same as in Embodiment 3.

In the magnetic sensor device in the present disclosure, the carrier 7 and the guide 14 are fixed. Therefore, when a temperature changes, the carrier 7 and the guide 14 warp due to the difference of the linear expansion of the carrier 7 and the guide 14.

In Embodiment 4, the rigidity of the guide 14 is reduced by forming the guide 14e of resin. This reduces the warp even if a difference of the linear expansion occurs between the carrier 7 and the guide 14 due to a temperature change, as the guide 14 follows the carrier 7.

In addition, as the rigidity of the guide 14 is reduced, there is concern that the movement of the yoke 10 in the Y direction cannot be sufficiently suppressed. Therefore the side wall portion of the guide 14 in the Y direction is suppressed from opening by making the height of the side wall portion of the guide 14 reach up to a middle of the height of the magnet 9 and by reducing the height in the Z direction. The yoke holder 14f for covering the side of the magnet 9 and the yoke 10 is provided to regulate the movement of the yoke 10 in the Y direction.

As the yoke holder 14f can regulate the movement of the yoke 10 in the Y direction with respect to the magnet 9, the yoke holder 14f is not required to be adhered and fixed to the magnet 9 and the yoke 10. Therefore, occurrence of warpage need not be considered due to the difference of the coefficient of linear expansion of the magnet 9 and the yoke 10, and the yoke holder 14f. Materials of the yoke holder 14f are not specifically limited.

In addition, in Embodiment 4, as the material of the guide 14e is resin and has a small thermal conductivity, heat dissipation from the radiator 11 cannot be expected even if the radiator 11 is provided like Embodiment 1 or 2. Therefore, in Embodiment 4, similar to Embodiment 3, a metal having a large thermal conductivity is used for materials of the case 2.

In addition, in Embodiment 4, if a movement of the magnet 9 either in the positive Y or the negative Y direction can be regulated at the side surface of the opening 2c in the case 2, the side wall portion of the guide 14e may only be provided on the opposite side. In that case, the yoke holder 14f covers the side surface on the side of the side wall portion of the magnet 9 and the yoke 10. In addition, in the configuration according to Embodiment 4, the section of the magnet 9 is not limited to a quadrangular shape, the section may be a polygon having 5 or more sides, or the magnet 9 may be a curvilinear column whose external shape is a circle, an ellipse or the like.

The foregoing describes some example embodiments for explanatory purposes. Although the foregoing discussion has presented specific embodiments, persons skilled in the art will recognize that changes may be made in form and detail without departing from the broader spirit and scope of the invention. Accordingly, the specification and drawings are to be regarded in an illustrative rather than a restrictive sense. This detailed description, therefore, is not to be taken in a limiting sense, and the scope of the invention is defined only by the included claims, along with the full range of equivalents to which such claims are entitled.

This application claims the benefit of Japanese Patent Application No. 2015-018152, filed on Feb. 2, 2015, the entire disclosure of which is incorporated by reference herein.

REFERENCE SIGNS LIST

1 Cover
1a Taper
1b Conveyance plane
2 Case (housing)
2a Step
2b, 2c, 2e Opening
2d Cover support
2f Board mounting surface
2g Board mounting hole
3 Sensor board
3a Non-conductive member
3b, 3c Conductive member
3d Positioning hole
3e Opening for the magnetoresistive effect element
3f Opening for signal amplification IC
4 Magnetoresistive effect element
5 Signal amplification IC
6 Wire
7 Carrier
7a Soft magnetic carrier
7b Nonmagnetic carrier
7c Positioning hole
7d Opening
8 Fastener
9 Magnet
10 Yoke
11 Radiator
13 Signal processing board
13a Board mounting hole
14 Guide
14a Carrier adhesion surface
14b Projection (recess)
14c Opening
14d Relief groove
14e Guide
14f Yoke holder
15 Cable
20 To-be-detected object
21 Conveyance direction

The invention claimed is:

1. A magnetic sensor device comprising:
a bar-shaped magnet;
a carrier that is arranged parallel to the magnet along the longitudinal direction of the magnet, that has a magnetoresistive effect element provided on a surface thereof that is opposite to another surface thereof facing the magnet, the carrier formed with a magnetic body that extends across the length of the magnet in the longitudinal direction; and
a guide that has a bottom portion interposed between the magnet and the carrier and a side wall portion standing upright from the bottom portion along a side surface of the magnet contacting in the longitudinal direction with a surface of the magnet facing the carrier, the bottom portion and the side wall portion being formed of a nonmagnetic body contacting the magnet and extending in the longitudinal direction of the magnet;
wherein the magnet is attracted to and held by the carrier, with the guide interposed therebetween, due to the magnetic attractive force between the magnet and the carrier; and
the magnet is adhered to the guide and is capable of sliding in the longitudinal direction with respect to the guide.

2. The magnetic sensor device according to claim 1, wherein
the side wall portion has a first side wall standing upright from one end in the transverse direction orthogonal to the longitudinal direction of the bottom portion, and a second side wall standing up from the other end in the transverse direction of the bottom portion; and
the magnet contacts with the first side wall and the second side wall, and is attracted to and held by the carrier, with the bottom portion interposed therebetween.

3. The magnetic sensor device according to claim 2, wherein
the guide is metal.

4. The magnetic sensor device according to claim 3, further comprising a yoke that is in close contact with the magnet on the opposite side of the carrier.

5. The magnetic sensor device according to claim 4, further comprising a radiator in close contact with the outermost surface of the guide on the opposite side of the carrier.

6. The magnetic sensor device according to claim 2, further comprising a radiator in close contact with the outermost surface of the guide on the opposite side of the carrier.

7. The magnetic sensor device according to claim 3, further comprising a radiator in close contact with the outermost surface of the guide on the opposite side of the carrier.

8. The magnetic sensor device according to claim 4, comprising a yoke holder covering the side surfaces of the magnet and the yoke,
wherein a height from the bottom portion of the side wall portion of the guide is a middle height of a side surface contacting along the longitudinal direction to a surface of the magnet facing the carrier.

9. The magnetic sensor device according to claim 2, further comprising a yoke that is in close contact with the magnet on the opposite side of the carrier.

10. The magnetic sensor device according to claim 9, further comprising a radiator in close contact with the outermost surface of the guide on the opposite side of the carrier.

11. The magnetic sensor device according to claim 9, comprising a yoke holder covering the side surfaces of the magnet and the yoke,
    wherein a height from the bottom portion of the side wall portion of the guide is a middle height of a side surface contacting along the longitudinal direction to a surface of the magnet facing the carrier.

12. The magnetic sensor device according to claim 1, wherein
    the guide is metal.

13. The magnetic sensor device according to claim 12, further comprising a yoke that is in close contact with the magnet on the opposite side of the carrier.

14. The magnetic sensor device according to claim 13, further comprising a radiator in close contact with the outermost surface of the guide on the opposite side of the carrier.

15. The magnetic sensor device according to claim 12, further comprising a radiator in close contact with the outermost surface of the guide on the opposite side of the carrier.

16. The magnetic sensor device according to claim 13, comprising a yoke holder covering the side surfaces of the magnet and the yoke,
    wherein a height from the bottom portion of the side wall portion of the guide is a middle height of a side surface contacting along the longitudinal direction to a surface of the magnet facing the carrier.

17. The magnetic sensor device according to claim 1, further comprising a yoke that is in close contact with the magnet on the opposite side of the carrier.

18. The magnetic sensor device according to claim 17, comprising a yoke holder covering the side surfaces of the magnet and the yoke,
    wherein a height from the bottom portion of the side wall portion of the guide is a middle height of a side surface contacting along the longitudinal direction to a surface of the magnet facing the carrier.

19. The magnetic sensor device according to claim 17, further comprising a radiator in close contact with the outermost surface of the guide on the opposite side of the carrier.

20. The magnetic sensor device according to claim 1, further comprising a radiator in close contact with the outermost surface of the guide on the opposite side of the carrier.

\* \* \* \* \*